United States Patent [19]
Kikkawa

[11] Patent Number: 5,837,056
[45] Date of Patent: Nov. 17, 1998

[54] METHOD FOR GROWING III-V GROUP COMPOUND SEMICONDUCTOR CRYSTAL

[75] Inventor: Toshihide Kikkawa, Kawasaki, Japan

[73] Assignee: Fujitsu Limited, Kawasaki, Japan

[21] Appl. No.: 832,274

[22] Filed: Apr. 3, 1997

Related U.S. Application Data

[62] Division of Ser. No. 451,436, May 26, 1995, Pat. No. 5,656,076.

[30] Foreign Application Priority Data

May 30, 1994 [JP] Japan ................................ 6-116151

[51] Int. Cl.$^6$ ................................................. C30B 25/22
[52] U.S. Cl. ................................ 117/84; 117/89; 117/104; 438/514
[58] Field of Search ................................ 117/84, 88, 89, 117/95, 102, 106, 104; 438/483, 514

[56] References Cited

U.S. PATENT DOCUMENTS

| | | | |
|---|---|---|---|
| 4,124,278 | 11/1978 | Bohling et al. | 349/17 |
| 4,904,616 | 2/1990 | Bohling et al. | 117/104 |
| 5,124,278 | 6/1992 | Bohling et al. | 438/514 |
| 5,445,992 | 8/1995 | Tokunaga et al. | 438/483 |

FOREIGN PATENT DOCUMENTS 6-045264 2/1994 Japan .

*Primary Examiner*—Felisa Garrett
*Attorney, Agent, or Firm*—Armstrong, Westerman, Hattori, McLeland & Naughton

[57] ABSTRACT

In a method for growing a III-V group compound semiconductor crystal, as a Si dopant, a compound including a Si atom bonded to an alkyl group and a hydrogen atom is used. Also, a compound including two Si atoms in one molecule thereof, at least one of said Si atoms being bonded to a hydrogen atom, and at least the other of said Si atoms being bonded to an alkyl group can be used. Further, a compound including two Si atoms in one molecule thereof, at least one of said Si atoms being bonded to a hydrogen atom, and at least the other of said Si atoms being bonded to a phenyl group or a compound including a Si atom bonded to an organic amino group can be used. Si can be doped evenly at a high concentration at a low temperature with a safe operation by the invention.

14 Claims, 8 Drawing Sheets

F I G. 1
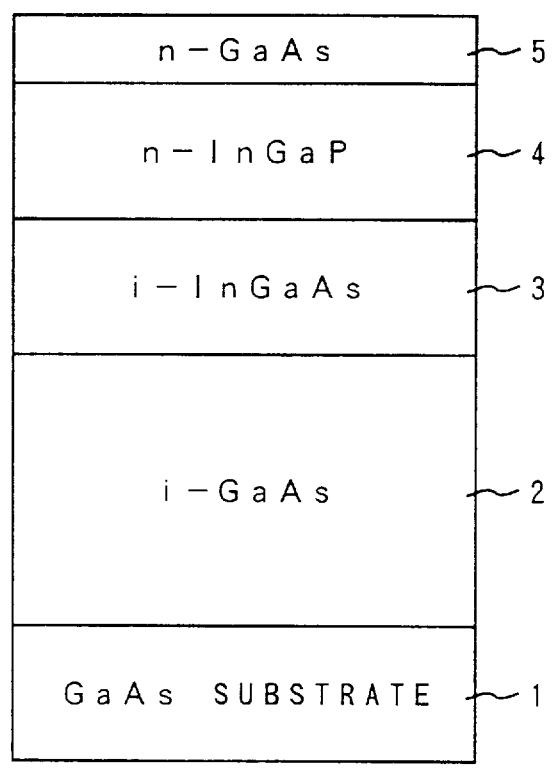

METHOD FOR GROWING III-V GROUP COMPOUND SEMICONDUCTOR CRYSTAL

This is a divisional of application Ser. No. 08/451,436 filed May 26, 1995 now U.S. Pat. No. 2,656,076.

BACKGROUND OF THE INVENTION

1. Field of the Invention

The present invention generally relates to a method for growing III-V group compound semiconductor crystal, and more particularly to a method for growing III-V group compound semiconductor crystal in which the uniform silicon doping is available at high concentration at low temperature.

2. Description of Prior Art

Currently, III-V group compound semiconductors are being used in a wide variety of fields because of a high speed operation due to a characteristic band structure which provides a reduced effective mass of electrons. A typical example of such a III-V group compound semiconductor device is a HEMT (High Electron Mobility Transistor). The HEMT includes an undoped channel layer and an n-type electron supplying layer provided on the channel layer. In such a structure, 2DEG (2 Dimensional Electron Gas) is formed in the channel layer along an interface to the electron supplying layer. By interrupting the 2DEG by means of a gate electrode, it is possible to switch the device on and off.

In this type of semiconductor device, the threshold voltage ($V_{th}$) for turning on and off the device is determined generally by a thickness of the electron supplying layer (t) and the carrier density thereof ($N_d$) according to the following equation:

$$V_{th}=cN_d t$$

c: constant.

Accordingly, controlling the thickness of the electron supplying layer and the carrier density is important. In order to form the semiconductor layer, a vapor-phase growth method is normally used.

When silicon (Si) is used as a dopant in a III-V group compound semiconductor crystal in this method, silane gas ($SiH_4$) or disilane gas ($Si_2H_6$) is conventionally used as the silicon material. However, two problems exist in the conventional method. One is a safety problem in handling the gases and the other is a high decomposition temperature of the gases.

As for the safety problem, as these gases are combustible and are normally stored in a tank at a high pressure, the gases may possibly explode and lead to a disaster due to a defect in the tank or an operation mistake. Accordingly, these gases have been controlled as a special high-pressure gas in the Japanese High Pressure Gas Control Act since 1992 in Japan. On the other hand, as a compound similar to the silicon compound in characteristics, arsine ($AsH_3$) or phosphine ($PH_3$) can be listed. However, since these compounds are poisonous, research on a substitute for the compounds has been conducted. t-butylarsine ($C_4H_9AsH_2$) or t-butylphosphine ($C_4H_9PH_2$) can be listed as the substitute.

However, as long as the Si material is a high-pressure combustible gas, there must be a countermeasure for the operation safety assuming an explosion even if the V group compound is substituted with a safe material.

As for the decomposition temperature problem, the bond energy of Si-H is relatively high and the decomposition rate thereof is low in Si material. Accordingly, disilane, which has a lower decomposition temperature than silane, is normally used when the doping is conducted at a high concentration of more than $10^{18}$ cm$^{-3}$. However, as a substrate and a growth furnace for the method are increased in size, a pressure at which vapor-phase growth is done is lowered in order to improve a uniformity of doping. Therefore, a dependency of doping efficiency on growth temperature cannot be disregarded, and it is difficult to improve a uniformity of donor concentration on the large-size substrate. The reason for the difficulty is that when the decomposition temperature is high and the crystal is grown at a reduced pressure, the decomposition rate is determined by the decomposition reaction rate.

On the other hand, when the decomposition temperature is low, the material is decomposed in the vapor phase. That is, the decomposition rate is determined by the diffusion rate of the material. In this case the uniformity of the donor concentration can be easily improved. One example having such characteristics is III group compound.

In order to realize an accurate process at a high concentration, for example, a non-alloy ohmic process, in which InGaAs doped with Si is grown at a high concentration equal to or higher than $10^{19}$ cm$^{-3}$ on the surface of a grown layer, is conducted. However, in this process, when InGaAs is grown on a GaAs substrate, the crystal surface becomes rugged and white due to the heterogeneity of lattice, which leads to polycrystallization. According to the latest research, it is necessary to extremely lower the growth temperature to under 500° C. in order to prevent the polycrystallization. However, as disilane is not decomposed at such a low temperature, the doping cannot be realized at a high concentration of more than $10^{19}$ cm$^{-3}$ unless an excess amount of disilane is introduced into the reaction tank.

If such an excess amount of Si doping material is introduced into the reaction tank, Si doping material may attach to the tank wall and remain in the tank. This produces a memory effect in the tank. Conventionally, it has been reported that Si doping material does not have the memory effect. This may be because the amount of the Si doping material used in the reaction was relatively less. Considering the vapor pressure of a Si element, when an excess amount of the Si doping material is used, the memory effects may possibly appear, just as for selenium (Se) and zinc (Zn) doping material in which memory effects have been reported.

In order to solve above-mentioned two problems, tetramethylsilane and hexamethydisilane, organic silicon compounds which are liquid at room temperature are disclosed in Japanese Laid-Open Patent Application No. 3-280419. However, if every hydrogen atom in a Si material is substituted by an alkyl group, the decomposition energy is increased. Accordingly, the decomposition temperature of the Si material is increased, and the resulting material is more difficult to handle than silane. The reason for this difficulty is considered to be a difference in characteristics between hydride of V family material and alkyl derivatives thereof. Also, when the material having only Si—C bonds is used, carbon atoms can be easily mixed into the acceptance site of the crystal and reduce the donor concentration.

As discussed above, when silane or disilane, which are the special combustible gas, is used, a big explosion may occur as the gas is stored at the high pressure in the tank.

Also, since the decomposition temperature of these gases is high, it is difficult to improve the uniformity of the doping efficiency on the large-size substrate.

Further, as the decomposition temperature of the above-mentioned compounds is relatively high, a large amount of Si material must be introduced in order to realize the high concentration doping at the low temperature. Therefore, the memory effects of the Si material in a reaction tank must be considered.

Moreover, the proposed substitute for silane has the very high decomposition temperature and has the structure into which carbon is easily mixed with Si. A substitute which satisfies the necessary characteristics to solve the above problems has not been proposed so far.

SUMMARY OF THE INVENTION

Accordingly, it is a general object of the present invention to provide a novel and useful method for growing a III-V group compound semiconductor crystal in which the demand described above is satisfied.

The above objects of the present invention are achieved by a method for growing a III-V group compound semiconductor crystal comprising the steps of, doping a III-V group compound semiconductor with a Si dopant and growing a crystal growth layer including III-V group compound semiconductor doped with the Si dopant, wherein the Si dopant includes a Si atom bonded to an alkyl group and a hydrogen atom.

The above objects of the present invention are also achieved by a method for growing a III-V group compound semiconductor crystal comprising the steps of, doping a III-V group compound semiconductor with a Si dopant and growing a crystal growth layer including the III-V group compound semiconductor doped with the Si dopant, wherein the Si dopant includes two Si atoms in one molecule thereof, at least one of the Si atoms being bonded to a hydrogen atom, and at least the other of the Si atoms being bonded to an alkyl group.

The above objects of the present invention are also achieved by a method for growing a III-V group compound semiconductor crystal comprising the steps of, doping a III-V group compound semiconductor with a Si dopant and growing a crystal growth layer including the III-V group compound semiconductor doped with the Si dopant, wherein the Si dopant has a general formula $SiR_{4-m}H_m$, in which R represents a phenyl group and m represents an integral number 1–3, and the phenyl group and the hydrogen atom are bonded to a Si atom.

The above objects of the present invention are also achieved by a method for growing a III-V group compound semiconductor crystal comprising the steps of, doping a III-V group compound semiconductor with a Si dopant and growing a crystal growth layer including the III-V group compound semiconductor doped with the Si dopant, wherein the Si dopant includes two Si atoms in one molecule thereof, at least one of the Si atoms being bonded to a hydrogen atom, and at least the other of the Si atoms being bonded to a phenyl group.

The above objects of the present invention are also achieved by a method for growing a III-V group compound semiconductor crystal comprising the steps of, doping a III-V group compound semiconductor with a Si dopant and growing a crystal growth layer including the III-V group compound semiconductor doped with the Si dopant, wherein the Si dopant includes a Si atom bonded to an organic amino group. In this method, a compound having a general formula, $SiR_{4-m}H_m$, in which R represents an organic amino group and m represents an integral number 1–3, and the organic amino group and the hydrogen atom are bonded to a Si atom, can be used.

The above objects of the present invention are also achieved by a method for growing a III-V group compound semiconductor crystal comprising the steps of doping a III-V group compound semiconductor with a Si dopant and growing a crystal growth layer including the III-V group compound semiconductor doped with the Si dopant, wherein the Si dopant includes two Si atoms in one molecule thereof, and at least one of the Si atoms is bonded to an organic amino group.

In the above inventions, the Si dopant can be a liquid at room temperature.

In the above methods of the present invention, the Si dopant can be a material having a general formula $SiR_{4-m-n}Q_nH_m$ or $SiRQXH$, in which R, Q and X represent a $C_1$–$C_{10}$ alkyl group, an amino group, and a phenyl group, m represents an integral number 1–3, n represents an integral number 0–2, and 4−m−n>0. In this case, the Si dopant can be selected from the group consisting of phenylsilane (PhSi), $C_5H_5SiH_3$, $(C_6H_5)_2SiH_2$, $(C_6H_5)_3SiH$, triethylsilane $((C_2H_5)_3SiH)$, diethylsilane $((C_2H_5)_2SiH_2])$, ethyldimethysilane $((C_2H_5)(CH_3)_2SiH)$, diethylmethylsilane $((C_2H_5)_2(CH_3)SiH)$, t-butylmethylsilane $(C_4H_9(CH_3)_2SiH])$, di-t-butyldimethylsilane $((C_4H_9)_2(CH_3)SiH)$, tetradimethylaminosilane $(((CH_3)_2N)_4Si)$, tridimethylaminosilane $(((CH_3)_2N)_3SiH)$, didimethylaminosilane $((CH_3)_2N)_2SiH_2])$ and methylaminosilane $((CH_3)_2NSiH_3)$ In the above-mentioned methods, the Si dopant can be a compound having a general formula, $Si_2(R_{3-m}H_m)(R_{3-n}H_n)$, in which R represents a $C_1$–$C_{10}$ alkyl group, an amino group or a phenyl group, m represents an integral number 1–3, n represents an integral number 0–2, and (n, m)=(0, 0), (3,3). In this case, the Si dopant can be selected from the group consisting of tetraethyldisilane $((C_2H_5)_4Si_2H_2)$, diethyldisilane $((C_2H_5)_2Si_2H_4)$, diethyldimethyldisilane $((C_2H_5)_2(CH_3)_2Si_2H_2)$ di-t-butyldimethyldisilane $((C_4H_9)_2)_2Si_2H_4)$, di-t-butyldisilane $((C_4H_9)_2Si_2H_4)$, tetradimethylaminodisilane $(((CH_3)_2N)_4Si_2H_2)$ and dimethylaminosilane $(((CH_3)_2N)_2Si_2H_4])$.

In the above-mentioned methods, the crystal growth layer can be selected from the group consisting of GaAs, AlGaAs, InGaAs, InAlAs, InGaP, InP, InAlGaP and InGaAsP.

In the above-mentioned methods of the present invention, an organic V family compound can be used as a V group compound material together with the III-V group compound semiconductor.

In the above-mentioned methods of the present invention, the crystal growth layer can be grown by one of an organic metal vapor-phase growth method, a gas source molecule growth method, and a chloride vapor-phase growth method.

In the present invention, the groups bonded to the Si are neither all hydrogen atoms nor all alkyl groups. The advantages of both hydrogen atoms and alkyl groups are designed to be utilized maximally. That is, the combination of hydrogen and an alkyl group, the combination of hydrogen and an amino group or the combination of hydrogen and a phenyl group is included in one molecule of the material. Therefore, a bond energy between the atoms tends to be partially different from the original compound and a stability of the molecule is lowered. Accordingly, the molecule can be easily decomposed and the decomposition temperature is lowered. Also, a reduction action of the hydrogen atoms prevents the carbon atoms from being mixed into the growth layer.

Even when the elements bonded to the silicon atom are only nitrogen atoms, that is, when only organic amino groups are bonded to the silicon atom, the decomposition temperature thereof is also lowered. This is because the bond energy of a Si—N bond is relatively low. Also, as a C—Si bond is not included in the molecule, contamination of the growth layer by carbon atoms is not a concern. Therefore, according to the present invention, as the amount of the material decomposed in the vapor phase is increased, the ideal doping whose decomposition rate is decided by the diffusion process is realized and the high concentration doping is available at the low temperature. Also, the whole process can be integrated through a non-alloy process.

Furthermore, by using the Si dopant material of the present invention with the organic V group compound, a usage of high-pressure gas can be avoided and a safe operation of the crystal growth can be realized. Also, the decomposition temperature of the Si material is lowered by the reaction with the organic V family material. Therefore, high-performance process can be realized.

Other objects and further features of the present invention will be apparent from the following detailed description when read in conjunction with the accompanying drawings.

BRIEF DESCRIPTION OF THE DRAWINGS

FIG. 1 is a diagrammatic illustration showing a HEMT structure grown by the first example of the present invention;

DETAILED DESCRIPTION OF THE INVENTION

Figure 2:
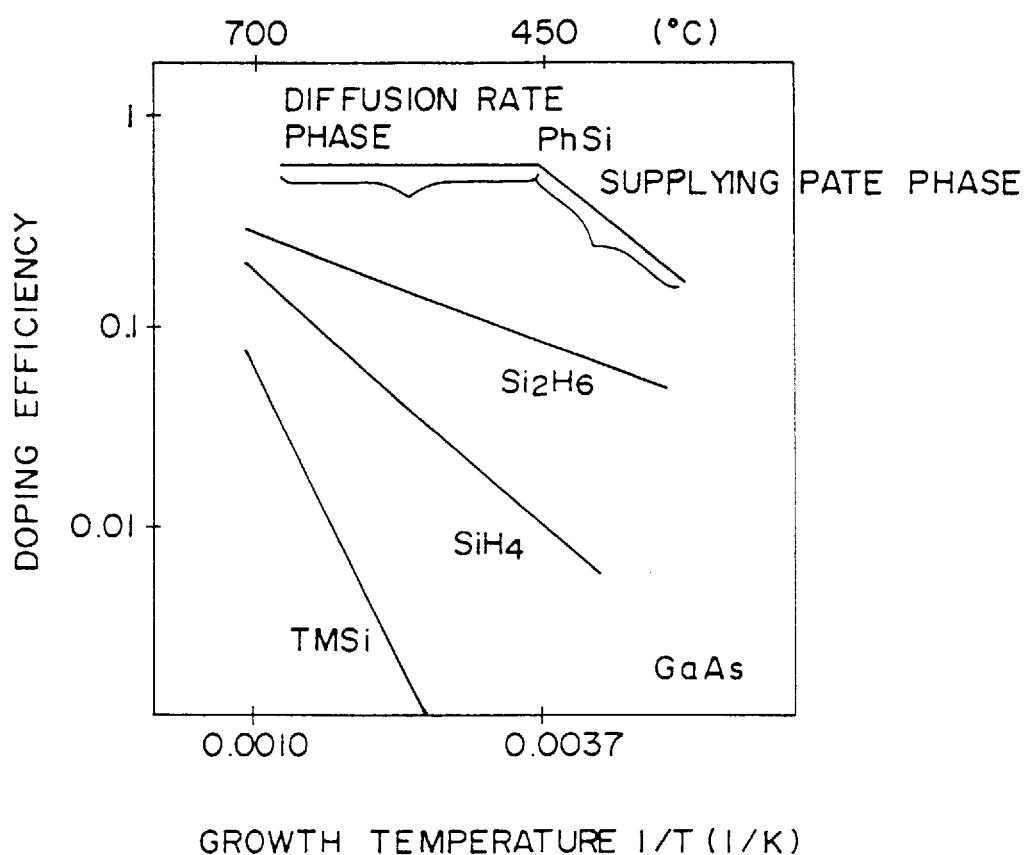
FIG. 2 is a graph showing a dependency of doping efficiency on crystal growth temperature in the first example of the present invention using GaAs.

Referring to the drawings, the present invention will now be described in detail.

Example 1

In this example of the present invention, a reduced pressure barrel-type MOCVD furnace was used to grow a III-V family compound semiconductor crystal.

The growth conditions were as follows.

1. Growth pressure
   50 torr
2. Substrate
   GaAs
3. Substrate size
   3 inches
4. III group material
   Trimethylgallium (TMGa)
   Triethylgallium (TEGa)
   Trimethylindium (TMIn)
5. V family material
   Arsine
   Phosphine
   t-butylarsine (TBA)
   t-butylphosphine (TBP)
6. Si material
   Phenylsilane (PHSi)
   $C_6H_5SiH_3$
   $(C_6H_5)_2SiH_2$
   $(C_6H_5)_3SiH$ Phenylsilane (PhSi) was supplied to a reaction tank by a bubbling method using hydrogen gas. The vapor pressure of phenylsilane is 3 torr at 20° C. As a contrast, disilane was also used as the Si material.

Also, in this example, when di-t-butylmethylsilane was used as the Si material as a substitute of phenysilane (PHSi), $C_6H_5SiH_3$, $(C_6H_5)_2SiH_2$, $(C_6H_5)_3SiH$, a similar result was obtained.

FIG. 1 is a diagrammatic illustration showing a HEMT structure grown in the first example. As shown in FIG. 1, on a GaAs substrate 1, an i-type GaAs buffer layer 2, an i-type InGaAs electron channel layer 3, a n-type InGaP electron supplying layer 4 and a n-type GaAs cap layer 5 were sequentially grown. Both the n-type InGaP electron supplying layer 4 and the n-type GaAs cap layer 5 were doped with Si.

FIG. 2 is a graph showing a dependency of doping efficiency on crystal growth temperature in the first example of the present invention using GaAs. In this graph, the horizontal axis shows the growth temperature and the longitudinal axis shows the doping efficiency. As is apparent from FIG. 2, a higher doping efficiency and a lower temperature dependency were obtained by using phenylsilane (PhSi) than by using tetramethyldisilane (TMSi), silane ($SiH_4$) and disilane ($Si_2H_6$).

Figure 3:
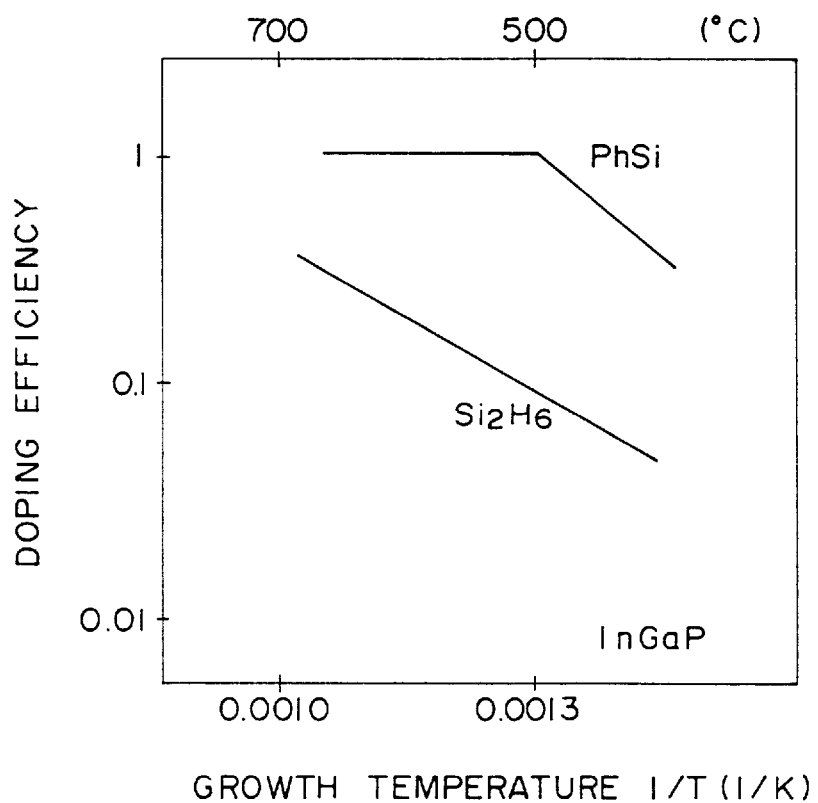
FIG. 3 is a graph showing a dependency of doping efficiency on crystal growth temperature in the first example of the present invention using InGaP.

FIG. 3 is a graph showing a dependency of doping efficiency on crystal growth temperature in the first example of the present invention using InGaP. In this graph, the horizontal axis shows the growth temperature and the longitudinal axis shows the doping efficiency. As is apparent from FIG. 3, a higher doping efficiency and a lower temperature dependency were obtained by using phenylsilane (PhSi) than by using disilane ($Si_2H_6$).

Figure 4:
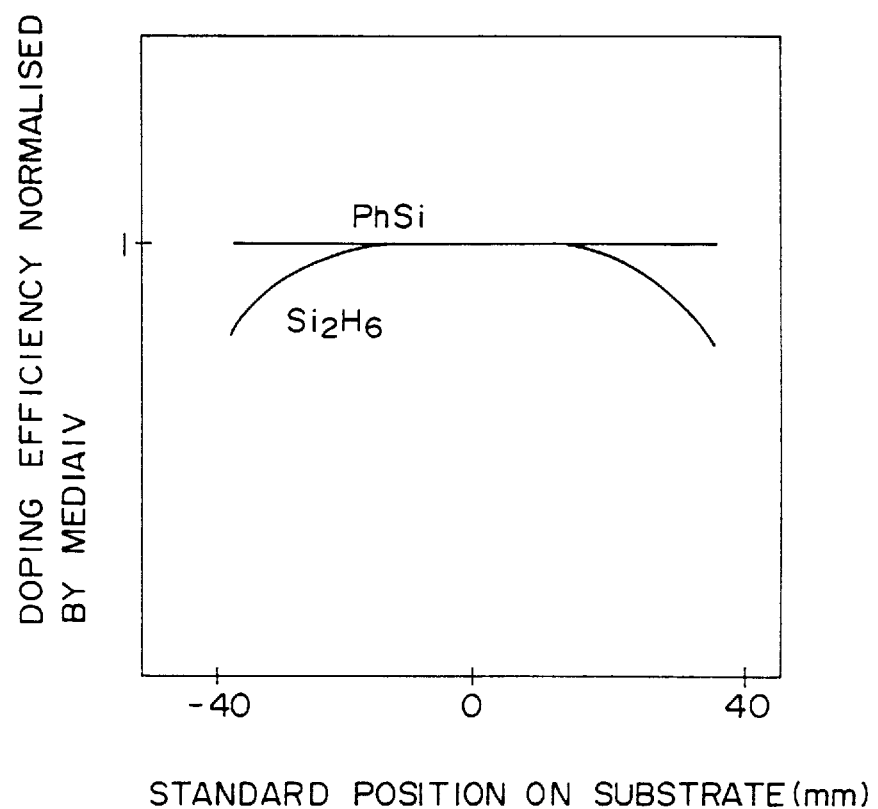
FIG. 4 is a graph showing a doping amount distribution on a substrate in the first example of the present invention using InGaP.

FIG. 4 is a graph showing a doping amount in InGaP in the first example of the present invention. In this graph, the horizontal axis shows the position on the substrate and the longitudinal axis shows donor concentration normalized by a median. As is apparent from FIG. 4, the donor was more evenly distributed by using phenylsilane (PhSi) than by using disilane ($Si_2H_6$). Also, the donor distribution was improved especially at the end of the substrate. A reason for the above result is that phenylsilane was doped when the molecule thereof is diffused. Also, the surface of the grown InGaP was tested by secondary ion mass spectrometry (SIMS). A contamination by carbon was not observed.

Figure 5:
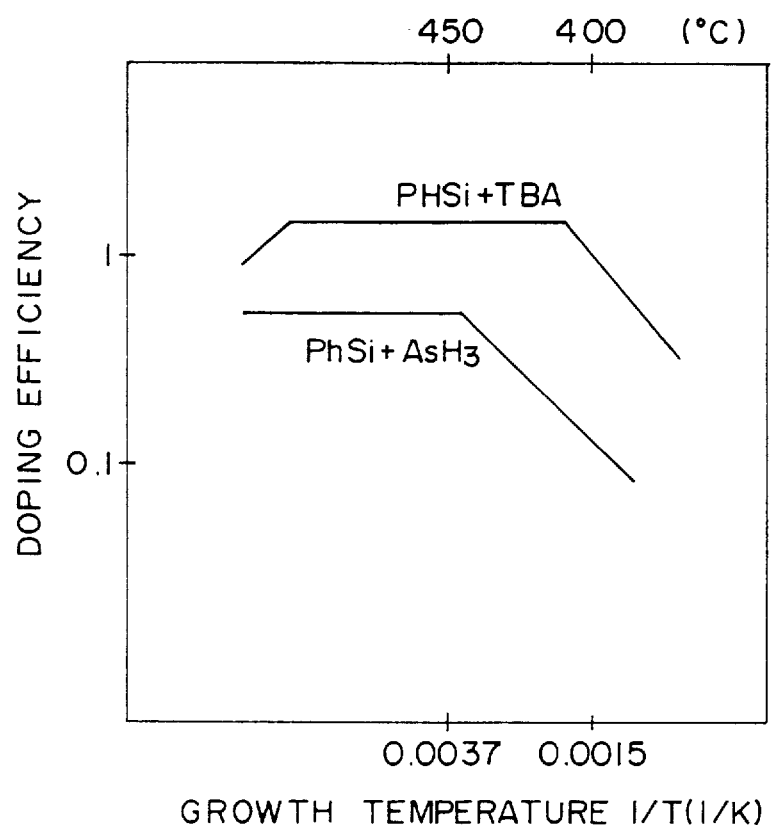
FIG. 5 is a graph showing a dependency of doping efficiency on crystal growth temperature in the first example of the present invention using GaAs and an organic material as a V group element.

FIG. 5 is a graph showing a dependency of doping efficiency on the crystal growth temperature in the first example of the present invention using GaAs and an organic material as a V group material. In this graph, the horizontal axis shows the growth temperature and the longitudinal axis shows the doping efficiency. As is apparent from FIG. 5, a higher doping efficiency and a lower temperature dependency were obtained by using phenylsilane (PhSi) and t-butylarsine (TBA) as a organic V group than by using phenylsilane and arsine.

Figure 6:
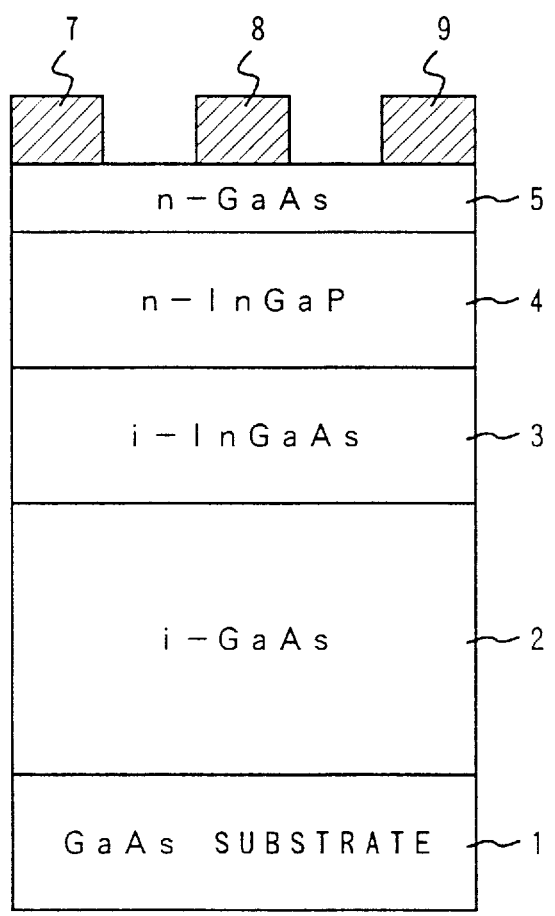
FIG. 6 is a diagrammatic illustration showing a III-V group compound semiconductor device formed by a first example of the present invention.

FIG. 6 is a diagrammatic illustration showing a HEMT grown by a method for growing III-V group compound semiconductor device of the second example of the present invention. In this device, a source electrode 7, a gate electrode 8 and a drain electrode 9 are provided on the n-type GaAs cap layer 5 of the HEMT structure formed by this example of the present invention.

Example 2

Figure 7:
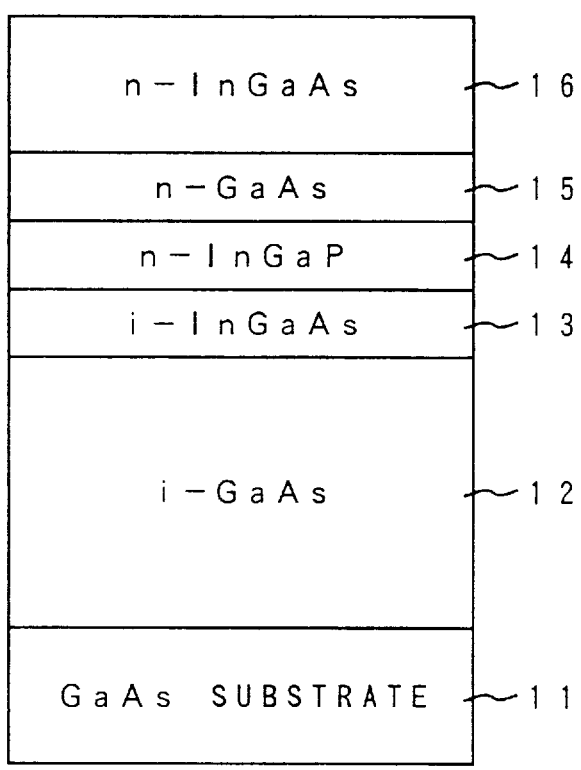
FIG. 7 is a diagrammatic illustration showing a HEMT structure grown by a second example of the present invention.

FIG. 7 is a diagrammatic illustration showing a HEMT structure grown by a second example of the present invention. As shown in FIG. 7, on a GaAs substrate 11, an i-type GaAs buffer layer 12, an i-type InGaAs electron channel layer 13, a n-type InGaP electron supplying layer 14, a n-type GaAs cap layer 5 and a n-type InGaAs cap layer 16 were sequentially grown. The n-type InGaP electron supplying layer 14, n-type GaAs cap layer 15 and the n-type InGaAs cap layer 16 were doped with Si.

In this example, in order to form a non-alloy ohmic contact layer, the n-type InGaAs cap layer ($In_{0.5}Ga_{0.5}As$) 16 was grown on the n-type GaAs cap layer 15. The reason for using $In_{0.5}Ga_{0.5}As$ as the n-type InGaAs cap layer 16 is because using In makes it easier to form ohmic electrodes. Because of a difference of the lattice constant between InAs and GaAs, the device is unstable. By adding In, the harmonization of ohmic characteristic and lattice constant is realized.

The crystal growth temperature was 450° C.

Figure 8:
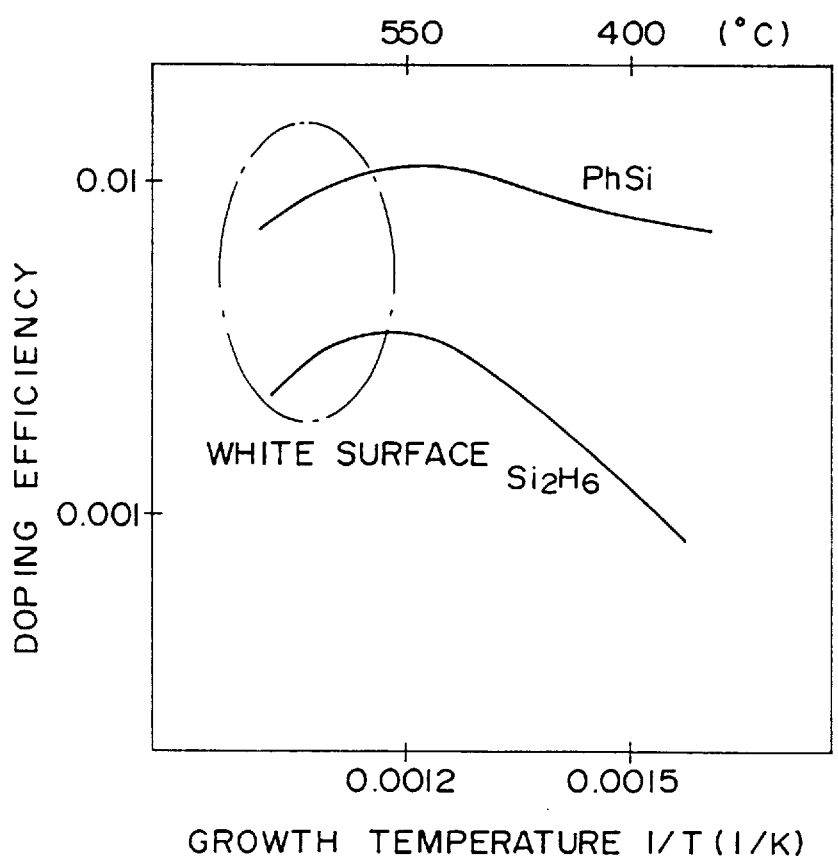
FIG. 8 is a graph showing a dependency of doping efficiency on crystal growth temperature in the second example of the present invention using GaAs.

FIG. 8 is a graph showing a crystal growth temperature dependency of GaAs doping efficiency in the second example of the present invention. In this graph, the horizontal axis shows the growth temperature and the longitudinal axis shows the doping efficiency. As is apparent from FIG. 8, a higher doping efficiency and a lower temperature dependency were obtained by using phenylsilane (PhSi) than by using disilane ($Si_2H_6$). When phenylsilane is used as a dopant, a donor concentration of over $10_{19}$ cm$^{-3}$ was easily accomplished according to quantitative analysis.

Further, the present invention, not limited to these examples, but various variations and modifications may be made without departing from the scope of the invention.

What is claimed is:

1. A method for growing a III-V group compound semiconductor crystal comprising the steps of:
   doping a III-V group compound semiconductor with a silicon dopant; and
   growing a crystal growth layer including growing said III-V group compound semiconductor doped with silicon dopant,
   wherein said silicon dopant has a general formula $SiR_{4-m}H_m$, in which R represents a phenyl group and m represents an integral number 1–3, said phenyl group and said hydrogen atom being bonded to silicon.

2. A method for growing a III-V group compound semiconductor crystal according to claim 1, wherein said silicon dopant is a liquid at room temperature.

3. A method for growing a III-V group compound semiconductor crystal according to claim 1, wherein said dopant has a general formula $SiR_{4-m-n}Q_nH_m$ or SiRQXH, in which R, Q and X represent a $C_1$–$C_{10}$ alkyl group, an amino group, and a phenyl group, m represents an integral number 1–3, n represents an integral number 0–2, and 4–m–n>0.

4. A method for growing an III-V group compound semiconductor crystal according to claim 3, wherein said silicon dopant is selected from a group consisting of phenylsilane, diphenylsilane, triphenylsilane, triethylsilane, diethylsilane, ethyldimethylsilane, diethylmethylsilane, t-butyldimethylsilane, di-t-butylmethylsilane, tetradimethylaminosilane, tridimethylaminosilane, didimethylaminosilane and methylaminosilane.

5. A method for growing a III-V group compound semiconductor crystal according to claim 1, wherein said crystal growth layer is selected from the group consisting of GaAs, AlGaAs, InGaAs, InAlAs, InGaP, InP, InAlGaP and InGaAsP.

6. A method for growing a III-V group compound semiconductor crystal according to claim 1, wherein an organic V family compound is used as a V family compound material together with said III-V group compound semiconductor.

7. A method for growing a III-V group compound semiconductor crystal according to claim 1, wherein said crystal growth layer is grown by one of the methods selected from the group consisting of an organic metal vapor-phase growth method, a gas source molecule growth method, and a chloride vapor-phase growth method.

8. A method for growing a III-V group compound semiconductor crystal, comprising the steps of:
   doping a III-V group compound semiconductor with a silicon dopant; and
   growing a crystal growth layer including said III-V group compound semiconductor doped with said silicon dopant,
   wherein said silicon dopant includes two silicon atoms in one molecule thereof, at least one of said silicon atoms being bonded to a hydrogen atom, and at least the other of said silicon atoms being bonded to a phenyl group.

9. A method for growing a III-V group compound semiconductor crystal according to claim 8, wherein said silicon dopant has a general formula $Si_2(R_{3-m})(R_{3-n}H_n)$, in which R represents a $C_1$–$C_{10}$ alkyl group, an amino group or a phenyl group, m represents an integral number 1–3, n represents an integral number and 0–2 (n, m)=(0, 0), (3,3).

10. A method for growing a III-V group compound semiconductor crystal according to claim 9, wherein said silicon dopant is selected from the group consisting of tetraethyldisilane, diethyldisilane, diethyldimethyldisilane, di-t-butyldimethyldisilane, di-t-butyldisilane, tetradimethylaminodisilane and dimethylaminodisilane.

11. A method for growing a III-V group compound semiconductor crystal according to claim 8, wherein said silicon dopant is a liquid at room temperature.

12. A method for growing a III-V group compound semiconductor crystal according to claim 8, wherein said crystal growth layer is selected from the group consisting of GaAs, AlGaAs, InGaAs, InAlAs, InGaP, InP, InAlGaP and InGaAsP.

13. A method for growing a III-V group compound semiconductor crystal according to claim 8, wherein an organic V family compound is used as a V family compound material together with said III-V group compound semiconductor.

14. A method for growing a III-V group compound semiconductor crystal according to claim 8, wherein said crystal growth layer is grown by one of the methods selected from the group consisting of an organic metal vapor-phase growth method, a gas source molecule growth method, and a chloride vapor-phase growth method.

* * * * *